United States Patent
Daellenbach et al.

(10) Patent No.: US 9,418,198 B1
(45) Date of Patent: Aug. 16, 2016

(54) METHOD FOR CALCULATING AN EFFECT ON TIMING OF MOVING A PIN FROM AN EDGE TO AN INBOARD POSITION IN PROCESSING LARGE BLOCK SYNTHESIS (LBS)

(71) Applicant: International Business Machines Corporation, Armonk, NY (US)

(72) Inventors: Lukas Daellenbach, Altdorf (DE); Niels Fricke, Herrenberg (DE); Michael H. Wood, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/619,168

(22) Filed: Feb. 11, 2015

(51) Int. Cl.
   *G06F 17/50* (2006.01)
(52) U.S. Cl.
   CPC .................. *G06F 17/5081* (2013.01)
(58) Field of Classification Search
   CPC . G06F 15/5072; G06F 17/50; G06F 17/5045; G06F 2217/84
   USPC .................................................. 716/119, 122
   See application file for complete search history.

(56) References Cited

U.S. PATENT DOCUMENTS

| | | | |
|---|---|---|---|
| 7,093,208 B2 | 8/2006 | Williams et al. | |
| 7,363,362 B1 * | 4/2008 | Friedman | H04L 12/42 370/222 |
| 7,814,451 B2 | 10/2010 | Furnish et al. | |
| 8,448,110 B2 | 5/2013 | Habitz et al. | |
| 8,453,093 B2 * | 5/2013 | Kim | G06F 17/5072 716/110 |
| 8,601,376 B2 * | 12/2013 | Morss | H04L 12/2818 700/83 |
| 8,782,589 B1 * | 7/2014 | Viswanath | G06F 17/5072 716/132 |
| 8,782,591 B1 | 7/2014 | Ku et al. | |
| 8,793,636 B2 * | 7/2014 | Alpert | G06F 17/5072 716/110 |
| 8,954,915 B2 * | 2/2015 | Chan | G06F 17/5072 716/119 |

OTHER PUBLICATIONS

U.S. Appl. No. 14/924,766, filed Oct. 28, 2015 entitled "Method for Calculating an Effect on Timing of Moving a Pin From an Edge to an Inboard Position in Processing Large Block Synthesis (LBS)".
Appendix P "List of IBM Patents or Patent Application Treated as Related" Dated Oct. 28, 2015; 2 Pages.

* cited by examiner

*Primary Examiner* — Sun Lin
(74) *Attorney, Agent, or Firm* — Edward P. Li

(57) ABSTRACT

A computer-implemented method for calculating an effect on timing of moving a pin from an edge position to an inboard position in processing large block synthesis (LBS). The method includes determining first timing details at the inboard position, based on internal wire segments between a signal source and the inboard position. The method further includes selecting an upper metal layer as a virtual wire between the edge position and the inboard position. The method further includes calculating capacitance and resistance of the virtual wire. The method further includes updating driver strength of a driver between the signal source and the inboard position. The method further includes determining second timing details at the inboard position, based on wire loads of the virtual wire. The method further includes modifying an assertion of the pin at the inboard position, based on the first timing details and the second timing details.

12 Claims, 8 Drawing Sheets

METHOD FOR CALCULATING AN EFFECT ON TIMING OF MOVING A PIN FROM AN EDGE TO AN INBOARD POSITION IN PROCESSING LARGE BLOCK SYNTHESIS (LBS)

TECHNICAL FIELD OF THE INVENTION

The present invention relates generally to microprocessor development, and more particularly to calculating an effect on timing of moving a pin from an edge to an inboard position in processing large block synthesis (LBS).

BACKGROUND

To improve the automation of synthesizing blocks in high-performance microprocessor designs, functional units are being flattened and all macros inside are merged into a single large, flat, high-performance block. This high-performance design style is called large-block synthesis (LBS). Large block synthesis (LBS) may generate better results, if critical timing signals do not connect to edge pins but synthesis places the appropriate terminal within an LBS block, which is known as internal pin placement. Since the pin assertions (i.e. timing information on arrival time, required arrival time, slew, or load capacitance) depend on the properties of the outside signal routes connecting to the pin, pin movements will change the connecting wire length and wire properties and thus the pin assertions used for synthesis.

SUMMARY

In one aspect, a method for calculating an effect on timing of moving a pin from an edge position to an inboard position in processing large block synthesis (LBS) is provided. The method is implemented by a computer program. The method includes determining first timing details at the inboard position, wherein the first timing details are determined based on a total length of one or more internal wire segments between a signal source and the inboard position. The method further includes selecting an upper metal layer as a virtual wire between the edge position and the inboard position, wherein the upper metal layer has a lower RC delay. The method further includes calculating capacitance and resistance of the virtual wire. The method further includes updating driver strength of a driver between the signal source and the inboard position, based on the capacitance and the resistance. The method further includes determining second timing details at the inboard position, wherein the second timing details are determined based on wire loads of the virtual wire. The method further includes modifying an assertion of the pin at the inboard position, based on the first and the second timing details.

In another aspect, a computer program product for calculating an effect on timing of moving a pin from an edge position to an inboard position in processing large block synthesis (LBS) is provided. The computer program product comprises a computer readable storage medium having program code embodied therewith. The program code is executable to: determine first timing details at the inboard position, wherein the first timing details are determined based on a total length of one or more internal wire segments between a signal source and the inboard position; select an upper metal layer as a virtual wire between the edge position and the inboard position, wherein the upper metal layer has a lower RC delay; calculate capacitance and resistance of the virtual wire; update driver strength of a driver between the signal source and the inboard position, based on the capacitance and the resistance; determine second timing details at the inboard position, wherein the second timing details are determined based on wire loads of the virtual wire; and modify an assertion of the pin at the inboard position, based on the first and the second timing details.

In yet another aspect, a computer system for calculating an effect on timing of moving a pin from an edge position to an inboard position in processing large block synthesis (LBS) is provided. The computer system comprises one or more processors, one or more computer readable tangible storage devices, and program instructions stored on at least one of the one or more computer readable tangible storage devices for execution by at least one of the one or more processors. The program instructions are executable to determine first timing details at the inboard position, wherein the first timing details are determined based on a total length of one or more internal wire segments between a signal source and the inboard position. The program instructions are executable to select an upper metal layer as a virtual wire between the edge position and the inboard position, wherein the upper metal layer has a lower RC delay. The program instructions are executable to calculate capacitance and resistance of the virtual wire. The program instructions are executable to update driver strength of a driver between the signal source and the inboard position, based on the capacitance and the resistance. The program instructions are executable to determine second timing details at the inboard position, wherein the second timing details are determined based on wire loads of the virtual wire. The program instructions are executable to modify an assertion of the pin at the inboard position, based on the first and the second timing details.

DETAILED DESCRIPTION

A method of the present invention analyzes the Manhattan distance for the pin movement (e.g. from edge pin position to the new inboard pin position) with respect to the connecting wire properties and re-adjusts the pin assertions after the new pin positions are derived by a first synthesis step. Re-adjustment of the pin assertions is to add an additional timing delay and slope degradation for the added wire length for input signals, as well as an additional capacitive wire load and timing delay for output signals. Synthesis will use the corrected assertions for more accurate results and faster convergence.

To improve signal timing on nets with bad slack and slew, normally lower metal layers with high RC-delay are replaced by higher metal layer with low RC-delay. Higher metal layers are wider and thicker than lower metal layers and thus reduce the metal layer resistance. Also, for a same distance, a higher metal layer reduces the number of refresh buffers than a lower metal layer.

In LBS, pins are moved inboard from an edge or moved from an inboard position to a new and better position.

Figure 1A:
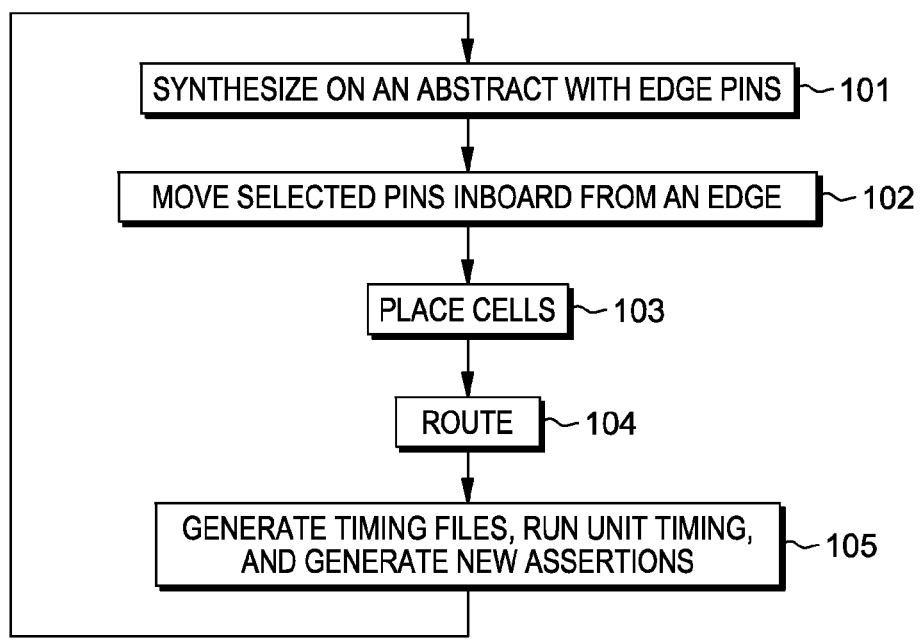
FIG. 1A is a diagram showing a current process of generating pin assertions in large block synthesis (LBS).

In current LBS, the distance between an old position and a new position is not considered in the assertions or driver strength. After synthesis and placement driven synthesis, LBS generates a new timing model for the new result. When all timing models of all LBS of a unit/core/chip are available, a new timing on the unit/core/chip is generated. The new timing shows slew/slack and wire delay problems, because moved pins create additional net length on the unit/core/chip side. The new timing generates new pin assertions for the LBS blocks and a new synthesis run is needed. On the unit/core/chip side, the additional wire length has to be considered for tagging. With the new tagged nets, a new buffering can be run to drive the changed nets. FIG. 1A is a diagram showing a current process of generating pin assertions in large block synthesis (LBS). The current process includes steps: to synthesize on an abstract with edge pins (101), to move selected pins inboard from an edge (102), to place cells (103), to route (104), and to generate timing files, run unit timing, and to generate new assertions (105). Shown in FIG. 1A, the iteration is needed. This iteration needs a lot of time and resources.

Figure 1B:
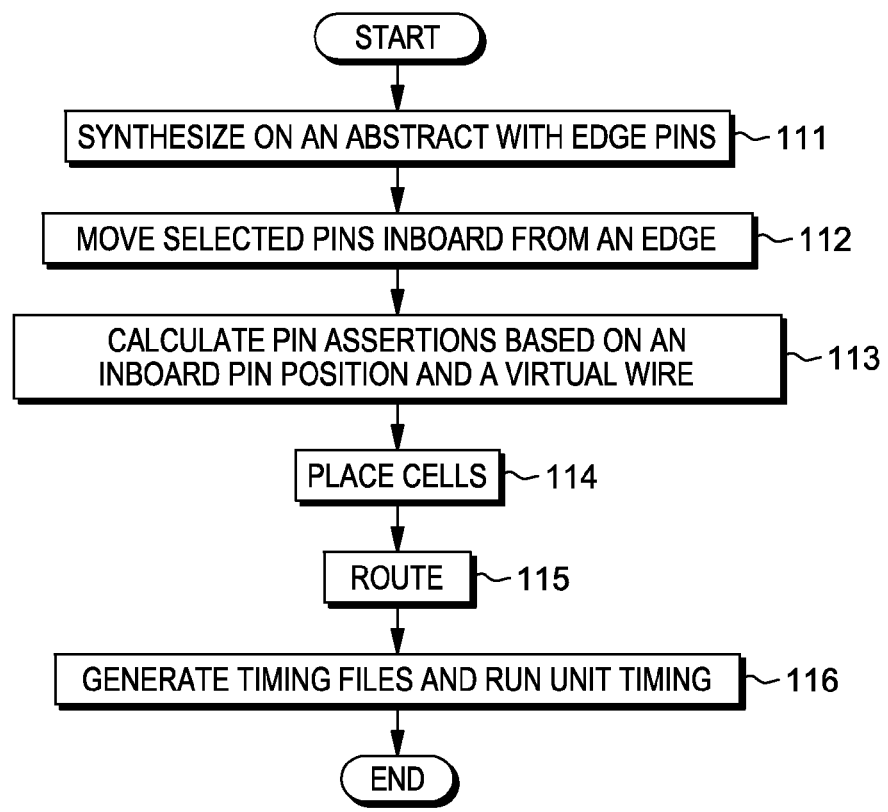
FIG. 1B is a diagram showing a proposed process of generating pin assertions in large block synthesis (LBS), in accordance with one embodiment of the present invention.

FIG. 1B is a diagram showing a proposed process of generating pin assertions in large block synthesis (LBS), in accordance with one embodiment of the present invention. The following are the operational steps: to synthesize on an abstract with edge pins (111), to move selected pins inboard from an edge (112), to calculate pin assertions based on an inboard pin position and a virtual wire (113), to place cells (114), to route (115), and generate timing files and run unit timing (116). Unlike the current process (shown in FIG. 1A) of generating pin assertions in large block synthesis (LBS), the proposed process uses an algorithm to calculate pin assertions and thus the proposed process does not need the iteration in current process.

Because a new pin position is normally directly behind a driver, timing details at a pin are improved when the pin is moved from an edge to an inboard position. The long distance between the driver and the pin or between the pin and a source needs long wires. Additional drivers are needed as a function of the distance and the metal layer. If the pin is moved close to the driver or source and the distance between the pin and the driver or source is short, the additional drivers can be saved. The LBS/macro needs a drive from the LBS/macro edge to the internal pin. This uses metal layers which span that distance without drivers. Normally, these metal layers have lower resistance than the internal net. Moving the pin saves driver delay and decreases wire delay. Also, a bigger driver for the new output pin is needed because the wire capacitance will increase and this will be reflect for the signal slew. An algorithm is needed for calculating the new driver strength after moving the pin. The calculation reflects external or virtual wire capacitance and slew at the macro/LBS edge.

Figure 2:
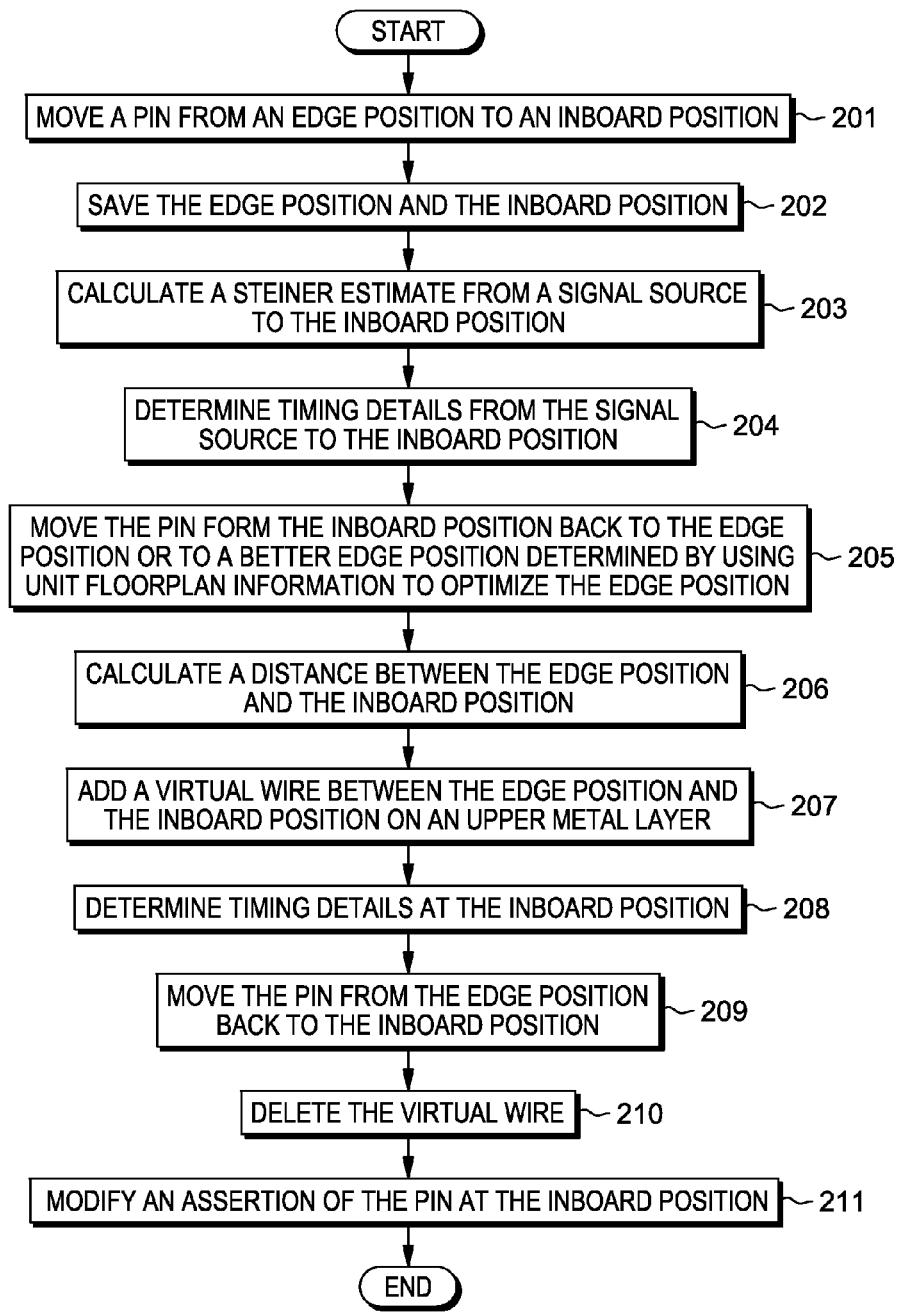
FIG. 2 is a flowchart showing operational steps of a computer program for calculating an effect on timing of moving a pin from an edge position to an inboard position in processing large block synthesis (LBS), in accordance with one embodiment of the present invention.

FIG. 2 is a flowchart showing the algorithm of a computer program for calculating an effect on timing of moving a pin from an edge position to an inboard position in processing large block synthesis (LBS), in accordance with one embodiment of the present invention. The computer program resides on a computer shown in FIG. 5. At step 201, the computer program moves a pin from an edge position to an inboard position. Moving the pin from the edge position to the inboard position improves the timing. At step 202, the computer program saves the edge position and the inboard position. At step 203, the computer program calculates a Steiner estimate from a signal source to the inboard position. At step 204, the computer program determines timing details from the signal source to the inboard position. The timing details include, for example, arrival time, slew, slack, wire capacitance, etc. At step 205, the computer program moves the pin from the inboard position back to the edge position or to a better edge position which is determined by using floorplan information to optimize the edge position. At step 206, the computer program calculates a distance between the edge position and the inboard position. At step 207, the computer program adds a virtual wire between the edge position and the inboard position on an upper metal layer. The virtual wire is added to the Steiner estimate at the inboard position to model an external wire segment on the upper metal layer. The added virtual wire changes the slew, the delay, and the capacitance of the total net. The length of the segment is from the inboard position to the macro edge position using a metal layer which bridges the gap. At step 208, the computer program determines timing details at the inboard position; the timing reflects now the wire loads due to adding the virtual wire. The timing details include, for example, arrival time, slew, slack, wire capacitance, etc. At step 209, the computer program moves the pin from the edge position back to the inboard position. At step 210, the computer program deletes the virtual wire. At step 211, the computer program modifies an assertion of the pin at the inboard position to reflect the timing change. This is reflected in a higher pin capacitance, a lower slew limit, required earlier arrival time, etc.

Figure 3A:
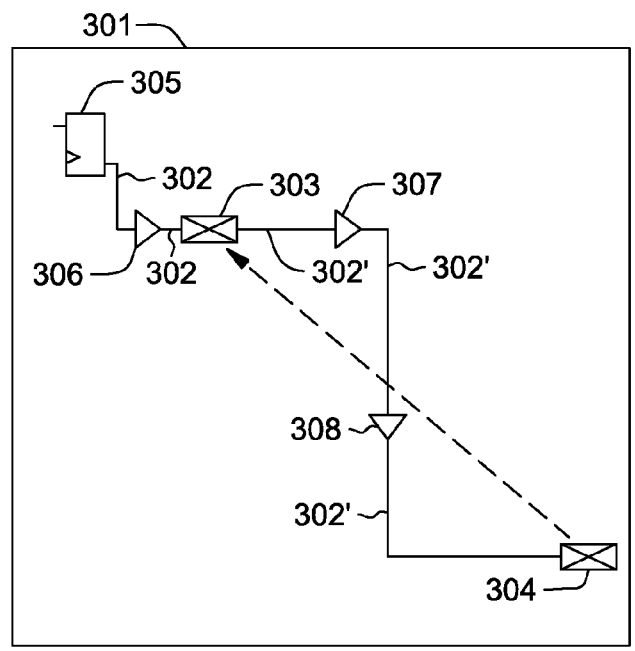
FIG. 3A is a diagram showing an illustration of moving a pin from an edge position to an inboard position, in accordance with one embodiment of the present invention.

FIG. 3A is a diagram showing an illustration of moving a pin from edge position 304 to inboard position 303, in accordance with one embodiment of the present invention. Numeral 301 represents the edge of the LBS. Numerals 302 and 302' represent internal wire segments or nets between edge position 304 and inboard position 303. Numeral 305 represents a signal source (in the embodiment, the signal source is a latch). Numerals 306, 307, and 308 represent first, second, and third drivers or buffers, respectively.

Figure 4A:
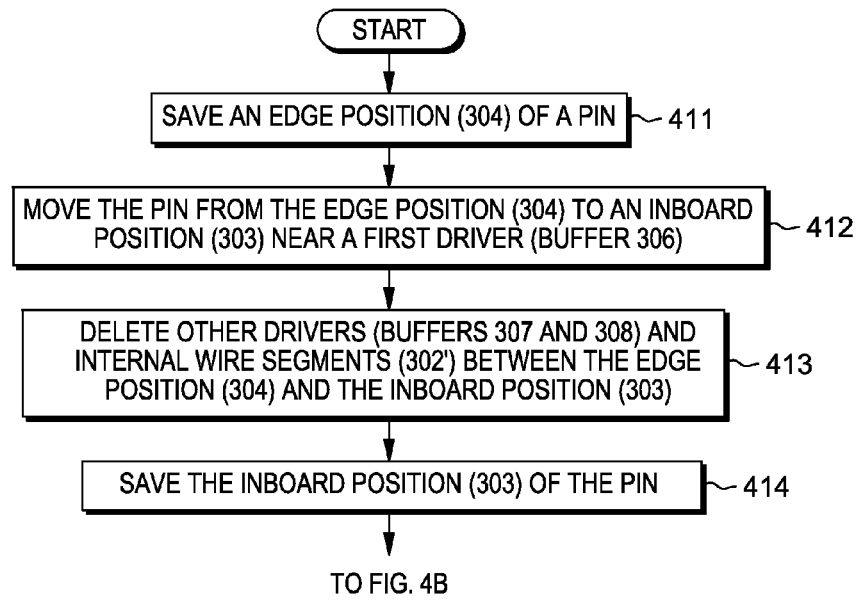
FIGS. 4A-4D are flowcharts showing operational steps corresponding to illustration of FIGS. 3A-3D, in accordance with one embodiment of the present invention.

FIG. 4A is a flowchart showing operational steps corresponding to the illustration of FIG. 3A, in accordance with one embodiment of the present invention. The operational steps are implemented by a computer program residing on a computer shown in FIG. 5. At step 411, the computer program saves edge position 304 of a pin. At step 412, the computer program moves the pin from edge position 304 to inboard position 303 near first driver or buffer 306. At step 413, the computer program deletes other drivers, i.e., second driver or buffer 307 and third drivers or buffers 308. At this step, the computer program also deletes internal wire segments 302' which are between edge position 304 and inboard position 303. At step 414, the computer program saves inboard position 303. Then, the computer program executes next steps shown in FIG. 4B.

Figure 3B:
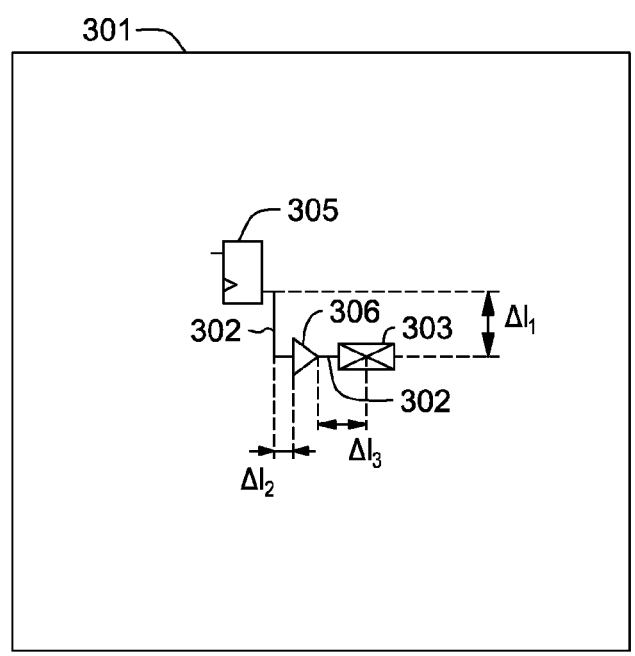
FIG. 3B is a diagram showing an illustration of calculating Steiner estimate from a source to the inboard position, in accordance with one embodiment of the present invention.
Figure 4B:
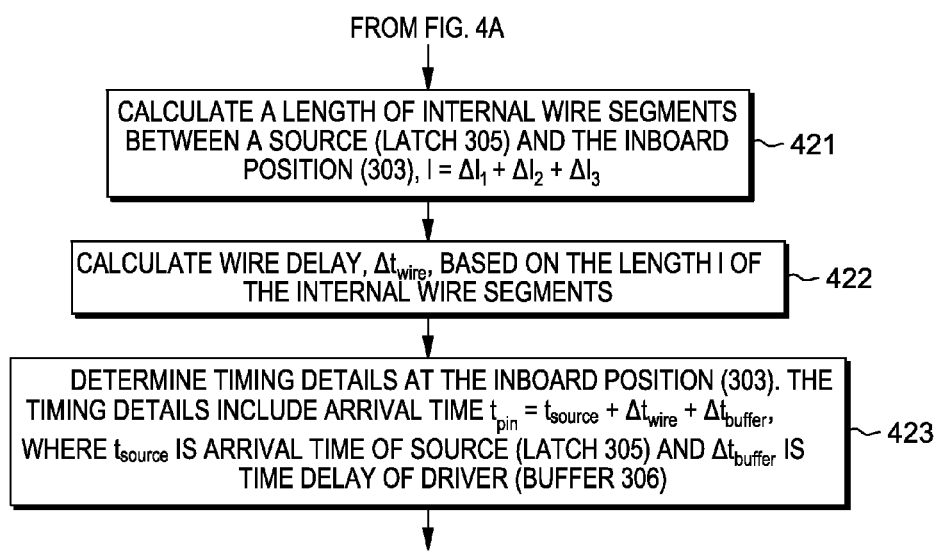

FIG. 3B is a diagram showing an illustration of calculating Steiner estimate from signal source 305 to inboard position 303, in accordance with one embodiment of the present invention. FIG. 4B is a flowchart showing operational steps corresponding to the illustration of FIG. 3B, in accordance with one embodiment of the present invention. The operational steps are implemented by a computer program residing on a computer shown in FIG. 5. At step 421, the computer program calculates a length of internal wire segments 302 between source or latch 305 and inboard position 303. The length l of internal wire segments 302 is a sum of $\Delta l_1$, $\Delta l_2$, and $\Delta l_3$, as shown in FIG. 3B. At step 422, the computer program calculates wire delay, $\Delta t_{wire}$, based on the length l of internal wire segments 302. At step 423, the computer program determines timing details at inboard position 303. The timing details include, for example, arrival time, slew, slack, wire capacitance, etc. The arrival time, $t_{pin}$, at inboard position 303 can be written as $$t_{pin} = t_{source} + \Delta t_{wire} + \Delta t_{buffer}$$

where $t_{source}$ is the arrival time of source or latch 305, $\Delta t_{wire}$ wire delay due to the length l of internal wire segments 302, and $\Delta t_{buffer}$ time delay of first driver 306. Then, the computer program executes next steps shown in FIG. 4C.

Figure 3C:
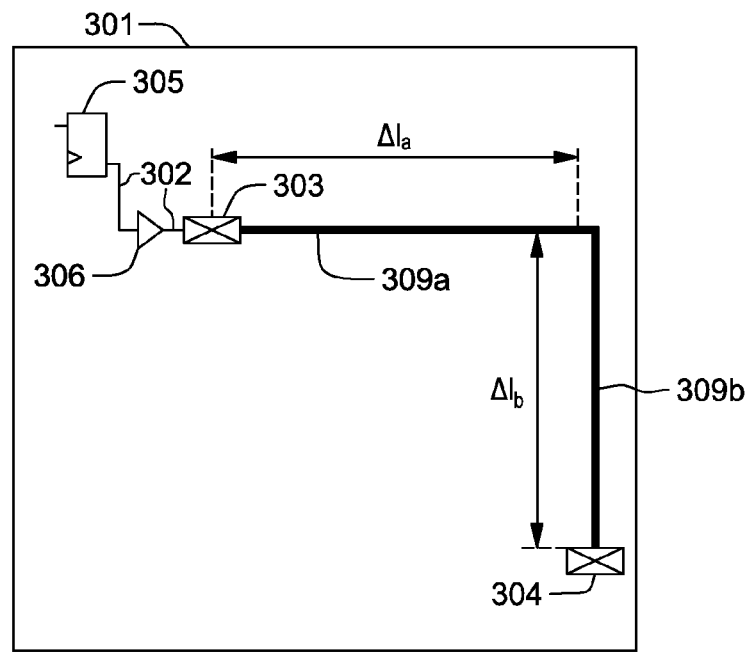
FIG. 3C is a diagram showing an illustration of moving the pin from the inboard position to the edge position and adding a virtual wire, in accordance with one embodiment of the present invention.
Figure 4C:
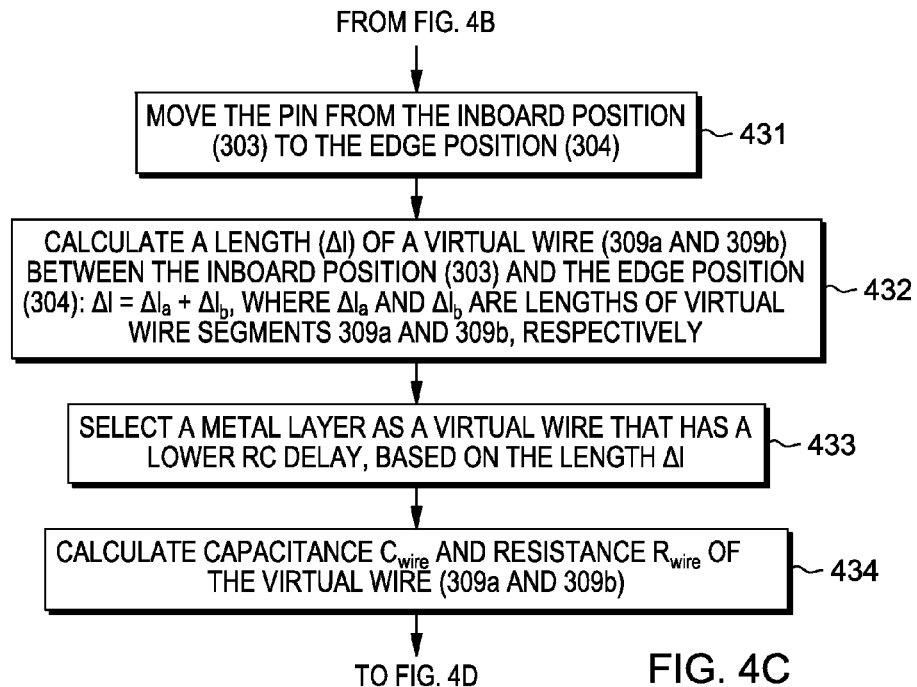

FIG. 3C is a diagram showing an illustration of moving the pin from inboard position 303 to edge position 304 and adding virtual wire segments 309a and 309b, in accordance with one embodiment of the present invention. FIG. 4C is a flowchart showing the algorithm of a computer program for processes corresponding to FIG. 3C, in accordance with one embodiment of the present invention. At step 431, the computer program moves the pin from inboard position 303 to edge position 304. At step 432, the computer program calculates a length ($\Delta l$) of virtual wire segments 309a and 309b (shown in FIG. 3C) between inboard position 303 and edge position 304. The length $\Delta l$ is a sum of lengths of segments 309a and 309b, written as follows:

$$\Delta l = \Delta l_a + \Delta l_b$$

where $\Delta l_a$ is the length of virtual wire segment 309a and $\Delta l_b$ the length of virtual wire segment 309b. At step 433, the computer program selects a metal layer as a virtual wire that has a lower RC delay, based on the length $\Delta l$. At step 434, the computer program calculates capacitance $C_{wire}$ and resistance $R_{wire}$ of the virtual wire (309a and 309b). Then, the computer program executes next steps shown in FIG. 4D.

Figure 3D:
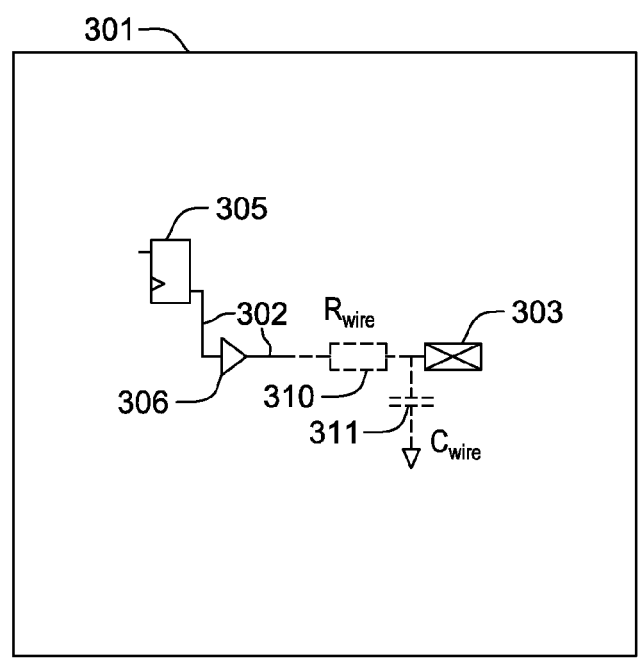
FIG. 3D is a diagram showing an illustration of using resistance and capacitance to update driver strength, in accordance with one embodiment of the present invention.
Figure 4D:
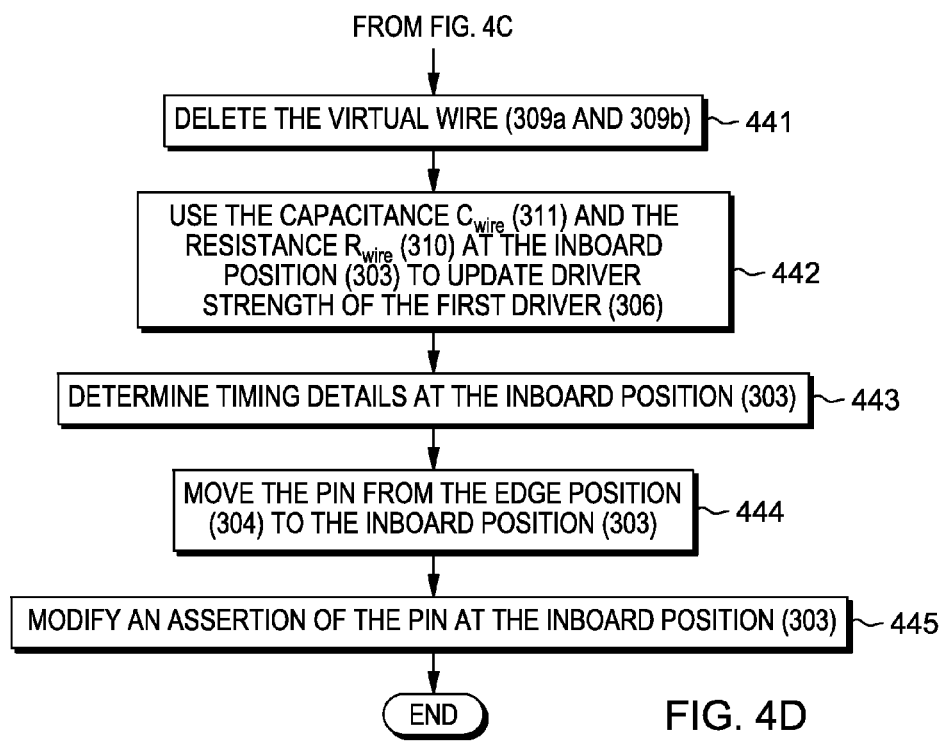

FIG. 3D is a diagram showing an illustration of adding resistance 310 and capacitance 311 to update driver strength, in accordance with one embodiment of the present invention. FIG. 4D is a flowchart showing operational steps corresponding to the illustration of FIG. 3D, in accordance with one embodiment of the present invention. The operational steps are implemented by a computer program residing on a computer shown in FIG. 5. At step 441, the computer program deletes the virtual wire (309a and 309b). At step 442, the computer program uses the capacitance $C_{wire}$ (311 shown in FIG. 3D) and resistance $R_{wire}$ (310 shown in FIG. 3D) at inboard position 303 to update the driver strength of first driver or buffer 306. At step 443, the computer program determines timing details at inboard position 303. The timing details reflects now the wire loads due to adding the virtual wire. The timing details at inboard position 303 include, for example, arrival time, slew, slack, wire capacitance, etc. At step 444, the computer program moves the pin from edge position 304 to inboard position 303. At step 445, the computer program modifies an assertion of the pin at inboard position 303.

Figure 5:
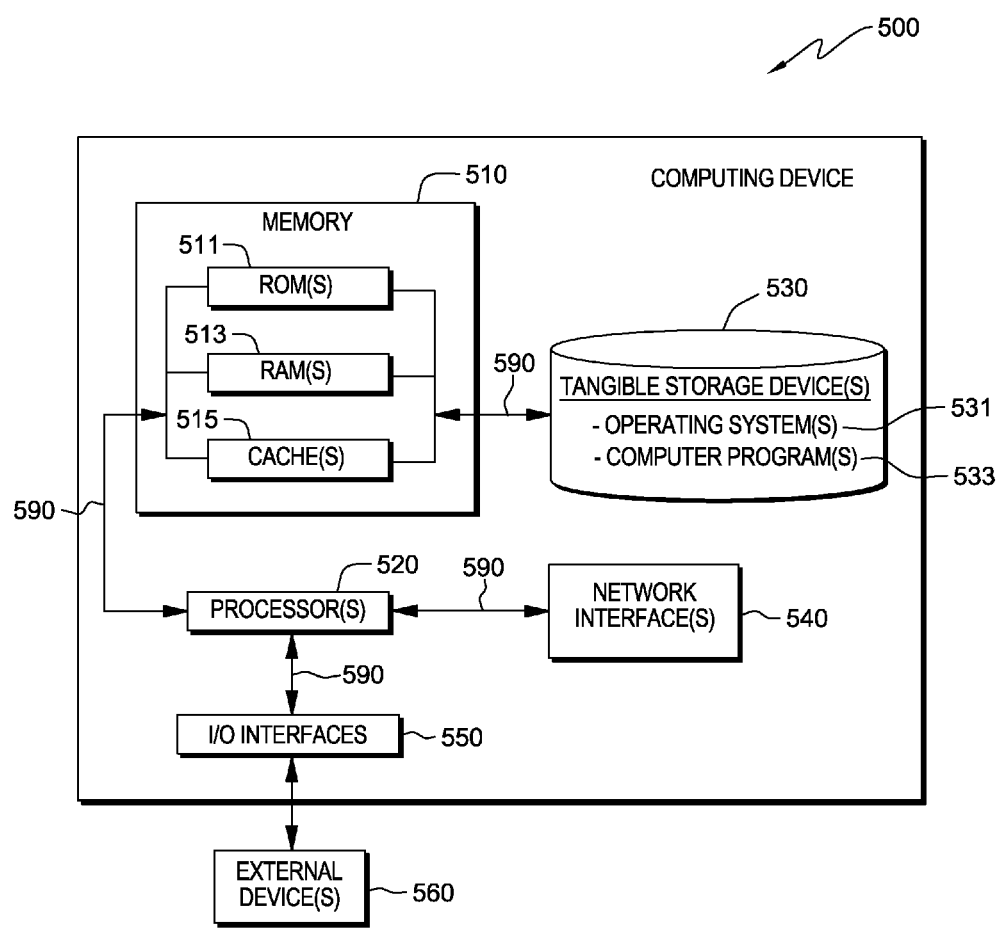
FIG. 5 is a diagram illustrating components of a computer device hosting a computer program for calculating an effect on timing of moving a pin from an edge position to an inboard position in processing large block synthesis (LBS), in accordance with one embodiment of the present invention.

FIG. 5 is a diagram illustrating components of computer device 500 hosting a computer program for calculating an effect on timing of moving a pin from an edge position to an inboard position in processing large block synthesis (LBS), in accordance with one embodiment of the present invention. It should be appreciated that FIG. 5 provides only an illustration of one implementation and does not imply any limitations with regard to the environment in which different embodiments may be implemented.

Referring to FIG. 5, computer device 500 includes processor(s) 520, memory 510, tangible storage device(s) 530, network interface(s) 540, and I/O (input/output) interface(s) 550. In FIG. 5, communications among the above-mentioned components of computing device 500 are denoted by numeral 590. Memory 510 includes ROM(s) (Read Only Memory) 511, RAM(s) (Random Access Memory) 513, and cache(s) 515. One or more operating systems 531 and one or more computer programs 533 reside on one or more computer readable tangible storage device(s) 530. The computer program for calculating an effect on timing of moving a pin from an edge position to an inboard position in processing large block synthesis (LBS) resides on one or more computer readable tangible storage device(s) 530. Computing device 500 further includes I/O interface(s) 550. I/O interface(s) 550 allows for input and output of data with external device(s) 560 that may be connected to computing device 500. Computing device 500 further includes network interface(s) 540 for communications between computing device 500 and a computer network.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device, such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network (LAN), a wide area network (WAN), and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++, and conventional procedural programming languages, such as the "C" programming language, or similar programming languages. The computer readable program instructions may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture, including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus, or other device to produce a computer implemented process, such that the instructions which execute on the computer, other programmable apparatus, or other device implement the functions/acts specified in the flowchart and/or block diagram block or blocks.

The flowchart and block diagrams in the FIGs illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the FIGs. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer program product for calculating an effect on timing of moving a pin from an edge position to an inboard position in processing large block synthesis (LBS), the computer program product comprising a non-transitory computer readable storage medium having program code embodied therewith, the program code, when executed by a computer, causing the computer to perform:
   determining first timing details at the inboard position, wherein the first timing details are determined based on a total length of one or more internal wire segments between a signal source and the inboard position;
   selecting an upper metal layer as a virtual wire between the edge position and the inboard position, wherein the upper metal layer has a lower RC delay;
   calculating capacitance and resistance of the virtual wire;
   updating driver strength of a driver between the signal source and the inboard position, based on the capacitance and the resistance of the virtual wire;
   determining second timing details at the inboard position, wherein the second timing details are determined based on wire loads of the virtual wire; and
   modifying an assertion of the pin at the inboard position, based on the first timing details and the second timing details.

2. The computer program product of claim 1, further comprising the program code causing the computer to perform:
   saving the edge position;
   moving the pin from the edge position to the inboard position;
   deleting one or more drivers and the one or more internal wire segments between the edge position and the inboard position;
   saving the inboard position;
   calculating the total length of the one or more internal wire segments between the signal source and the inboard position; and
   calculating a wire delay of the one or more internal wire segments between the signal source and the inboard position, based on the total length.

3. The computer program product of claim 1, further comprising the program code causing the computer to perform:

moving the pin from the inboard position to the edge position, before selecting the upper metal layer as the virtual wire.

4. The computer program product of claim 1, further comprising the program code causing the computer to perform:
calculating a length of the virtual wire.

5. The computer program product of claim 1, further comprising the program code causing the computer to perform:
deleting the virtual wire, before modifying the assertion of the pin at the inboard position.

6. The computer program product of claim 1, further comprising the program code causing the computer to perform:
moving the pin from the edge position to the inboard position, before modifying the assertion of the pin at the inboard position.

7. A computer system for calculating an effect on timing of moving a pin from an edge position to an inboard position in processing large block synthesis (LBS), the computer system comprising:
one or more processors, one or more computer readable tangible storage devices, and program instructions stored on at least one of the one or more computer readable tangible storage devices, when executed by at least one of the one or more processors, causing the at least one of the one or more processors to perform:
determining first timing details at the inboard position, wherein the first timing details are determined based on a total length of one or more internal wire segments between a signal source and the inboard position;
selecting an upper metal layer as a virtual wire between the edge position and the inboard position, wherein the upper metal layer has a lower RC delay;
calculating capacitance and resistance of the virtual wire;
updating driver strength of a driver between the signal source and the inboard position, based on the capacitance and the resistance of the virtual wire;
determining second timing details at the inboard position, wherein the second timing details are determined based on wire loads of the virtual wire; and
modifying an assertion of the pin at the inboard position, based on the first timing details and the second timing details.

8. The computer system of claim 7, further comprising the program instructions causing the at least one of the one or more processors to perform:
saving the edge position;
moving the pin from the edge position to the inboard position;
deleting one or more drivers and the one or more internal wire segments between the edge position and the inboard position;
saving the inboard position;
calculating the total length of the one or more internal wire segments between the signal source and the inboard position; and
calculating a wire delay of the one or more internal wire segments between the signal source and the inboard position, based on the total length.

9. The computer system of claim 7, further comprising the program instructions causing the at least one of the one or more processors to perform:
moving the pin from the inboard position to the edge position, before selecting the upper metal layer as the virtual wire.

10. The computer system of claim 7, further comprising the program instructions causing the at least one of the one or more processors to perform:
calculating a length of the virtual wire.

11. The computer system of claim 7, further comprising the program instructions causing the at least one of the one or more processors to perform:
deleting the virtual wire, before modifying the assertion of the pin at the inboard position.

12. The computer system of claim 7, further comprising the program instructions causing the at least one of the one or more processors to perform:
moving the pin from the edge position to the inboard position, before modifying the assertion of the pin at the inboard position.

* * * * *